(12) United States Patent
Russell et al.

(10) Patent No.: US 8,284,593 B2
(45) Date of Patent: Oct. 9, 2012

(54) MULTI-PORT MEMORY HAVING A VARIABLE NUMBER OF USED WRITE PORTS

(75) Inventors: Andrew C. Russell, Austin, TX (US); Shayan Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 233 days.

(21) Appl. No.: 12/760,039

(22) Filed: Apr. 14, 2010

(65) Prior Publication Data

US 2011/0255361 A1   Oct. 20, 2011

(51) Int. Cl.
*G11C 11/00* (2006.01)

(52) U.S. Cl. ........ 365/154; 365/149; 365/226; 365/227; 365/228; 365/229

(58) Field of Classification Search .................. 365/154, 365/149, 226–229
See application file for complete search history.

(56) References Cited

U.S. PATENT DOCUMENTS

| | | | |
|---|---|---|---|
| 7,130,238 B1 * | 10/2006 | Yu et al. | 365/230.05 |
| 7,489,540 B2 | 2/2009 | Ramaraju et al. | |
| 7,558,145 B2 | 7/2009 | Rao et al. | |
| 2005/0047218 A1 | 3/2005 | Kirihata et al. | |
| 2005/0251713 A1 | 11/2005 | Lee | |
| 2006/0215465 A1 | 9/2006 | Bhavnagarwala et al. | |
| 2008/0316851 A1 * | 12/2008 | Kinoshita et al. | 365/230.05 |
| 2009/0080271 A1 | 3/2009 | Amirante et al. | |
| 2010/0002531 A1 * | 1/2010 | Lee et al. | 365/226 |
| 2011/0211384 A1 * | 9/2011 | Perisetty | 365/154 |

OTHER PUBLICATIONS

PCT Application, PCT/US2011/030735, Search Report and Written Opinion dated Mar. 31, 2011.

* cited by examiner

*Primary Examiner* — Vu Le
*Assistant Examiner* — Han Yang
(74) *Attorney, Agent, or Firm* — James L. Clingan, Jr.

(57) ABSTRACT

A multi-port memory is operated according to a method. Data is written, in a first mode, to a storage node of a memory cell from a first port through a first conductance. The first mode is characterized by a power supply voltage being applied at a power node at a first level. Data is written, in a second mode, to the storage node of the memory cell simultaneously from the first port through the first conductance and a second port through a second conductance. The second mode is characterized by the power supply voltage being applied at the power node at a second level different from the first level.

19 Claims, 4 Drawing Sheets

MULTI-PORT MEMORY HAVING A VARIABLE NUMBER OF USED WRITE PORTS

BACKGROUND

1. Field

This disclosure relates generally to semiconductors, and more specifically, to semiconductor memories.

2. Related Art

Conventional memory bit cells require a minimum amount of voltage to reliably write data to the cells. Trends in the development of semiconductor memories are to scale down the size of memory cells as well as to scale down the voltages associated with a memory circuit. As write or program voltages used to write data to a memory cell decrease, the reliability of the write operation is jeopardized. Others have used multiple supply voltages wherein a higher voltage is used to improve either a write margin or a read margin. Lower voltages are used for other non-memory functions on an integrated circuit. However, the need to provide multiple supply voltages is a disadvantage because additional integration effort is required and may not be feasible since additional power rails cannot always be guaranteed. Also, additional voltage regulators may be required to supply a higher valued write or program voltage. Thus conventional memory bit cells are often inadequate to reliably operate with the desired lower supply voltages used in advanced semiconductors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

There is herein disclosed a multiple port memory having improved write or program margins for low voltage operation. In one form, the multiple port memories disclosed herein may reliably be written with less than one volt by entering into a low voltage mode. In one form, in the low voltage mode two or more write ports of the memory are used to write a data bit into a single memory cell.

Figure 1:
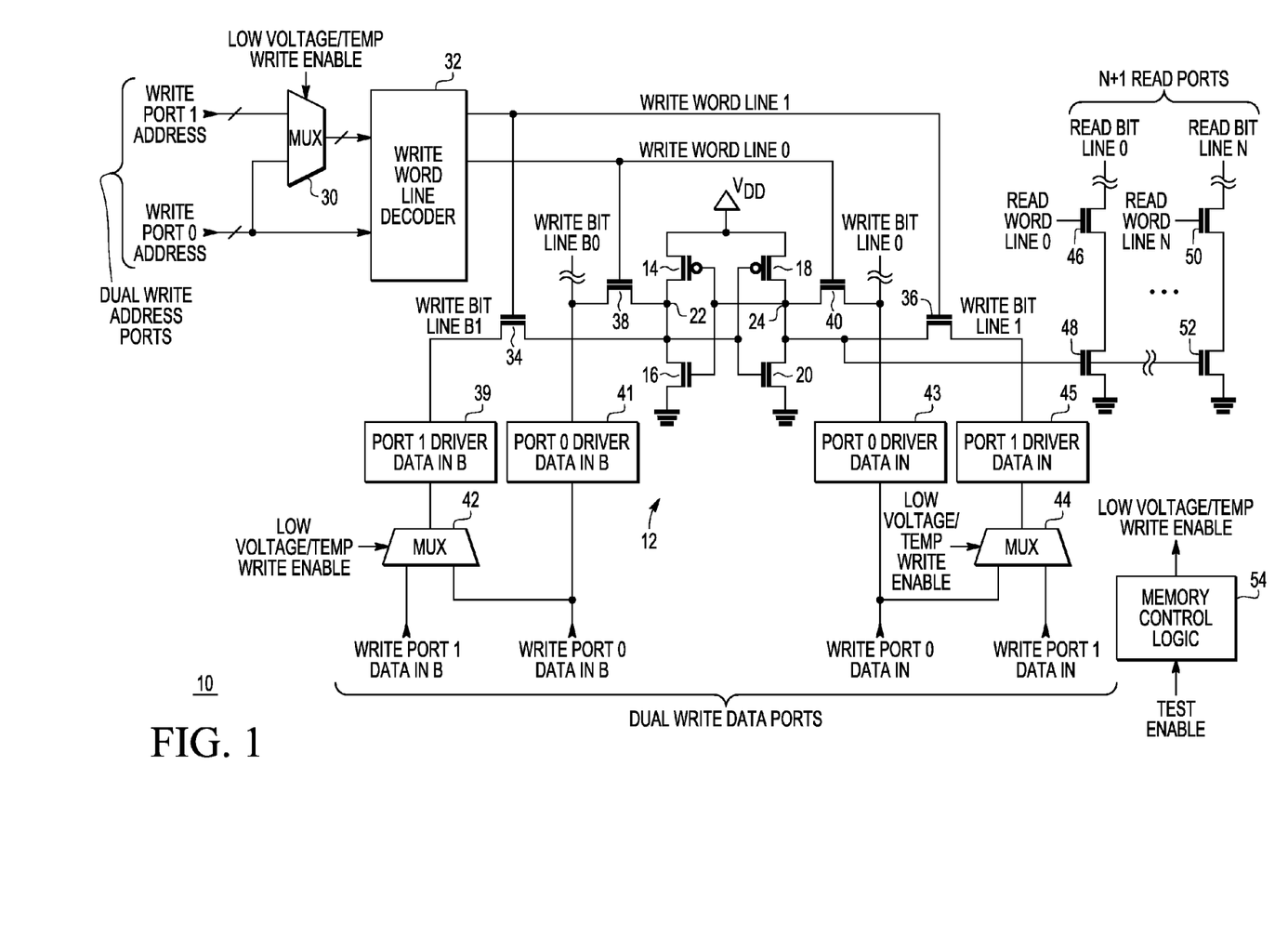
FIG. 1 is a block diagram of a first form of a semiconductor memory having multiple write ports which can vary in the number which are used.

Illustrated in FIG. 1 is a multiple-port memory 10 generally having multiple write ports, multiple read ports and a memory bit cell 12. The memory bit cell 12 has a P-channel transistor 14 having a source connected to a terminal for receiving a supply voltage labeled $V_{DD}$. A drain of transistor 14 is connected to a drain of an N-channel transistor 16 at a storage node 22. A source of transistor 16 is connected to a ground reference terminal. A P-channel transistor 18 has a source connected to the terminal for receiving $V_{DD}$. A drain of transistor 18 is connected to a drain of an N-channel transistor 20 at a storage node 24. A source of transistor 20 is connected to the ground reference terminal. A gate of transistor 14 is connected to a gate of transistor 16 and to the storage node 24. A gate of transistor 18 is connected to a gate of transistor 20 and to the storage node 22. Two dual write address ports are connected to a multiplexer which is labeled as a "Mux" in an abbreviated form. In particular, a multiple-bit write port 1 address is connected to a first input of a multiplexer 30. A multiple-bit write port 0 address is connected to a second input of the multiplexer 30. A control input of multiplexer 30 is connected to a low voltage write enable signal. When the low voltage write enable signal is not asserted, multiplexer 30 passes the write port 1 address. When the low voltage write enable signal is asserted, multiplexer 30 passes the write port 0 address. An output of multiplexer 30 is connected to a first input of a write word line decoder 32. The multiple-bit write port 0 address is also connected to a second input of the write word line decoder 32. A first output of the write word line decoder 32 functions as a Write Word Line 1 and is connected to a gate of a pass transistor 34 and to a gate of a pass transistor 36. A second output of the write word line decoder 32 functions as a Write Word Line 0 and is connected to a gate of a pass transistor 38 and to a gate of a pass transistor 40.

The multiple-port memory 10 also has dual write data ports for receiving data to be written to the memory bit cell 12. In the illustrated form a port 0, and complement thereof, and a port 1, and complement thereof, are detailed. A first input of a multiplexer 42 is connected to the Write Port 1 Data InB input. This is the complementary data input for port 1. A second input of multiplexer 42 is connected to the Write Port 0 Data InB input. This is the complementary data input for port 0. A control input of the multiplexer 42 is connected to the low voltage write enable signal. When the low voltage write enable signal is asserted, multiplexer 42 passes the write port 0 data inB port signal. When the low voltage write enable signal is not asserted, multiplexer 42 passes the write port 1 data inB port signal. An output of multiplexer 42 is connected to an input of a port 1 driver circuit 39 of data inB (complementary input data). An output of the port 1 driver circuit 39 provides a write bitline labeled Write Bitline B1 and is connected to a first current electrode or source of pass transistor 34. A second current electrode or drain of pass transistor 34 is connected to the storage node 22 of the memory bit cell 12. The Write Port 0 Data InB input is also connected to an input of a port 0 driver circuit 41 of data inB. An output of the port 0 driver circuit 41 provides a write bitline labeled Write Bitline B0 and is connected to a first current electrode or source of pass transistor 38. A second current electrode or drain of pass transistor 38 is connected to the storage node 22 of the memory bit cell 12. A first input of a multiplexer 44 is connected to the Write Port 1 Data In input. This is the data input for port 1. A second input of multiplexer 44 is connected to the Write Port 0 Data In input. This is the data input for port 0. A control input of multiplexer 44 is connected to the low voltage write enable signal. When the low voltage write enable signal is asserted, multiplexer 44 passes the write port 0 data in signal. When the low voltage write enable signal is not asserted, multiplexer 44 passes the write port 1 data in signal. An output of multiplexer 44 is connected to an input of a port 1 driver circuit 45 of data in. An output of the port 1 driver circuit 45 provides a write bitline labeled Write Bitline 1 and is connected to a first current electrode or source of pass transistor 36. A second current electrode or drain of pass transistor 36 is connected to the storage node 24 of the memory bit cell 12. The Write Port 0 Data In input is also connected to an input of a port 0 driver circuit 43 of data in. An output of the port 0 driver circuit 43 provides a write bitline labeled Write Bitline 0 and is connected to a first current electrode or source of pass transistor 40. A second current electrode or drain of pass transistor 40 is connected to the storage node 24 of the memory bit cell 12. In the illustrated form, the pass transistors 34, 36, 38 and 40 are N-channel transistors.

The multiple-port memory 10 also has N+1 read ports for providing data that is being read. In the illustrated form the number N is an arbitrary number which is an integer. A first read transistor 48 and an Nth read transistor 52 each have a gate connected to the storage node 24. A source of each of transistors 48 and 52 is connected to a ground reference terminal. A drain of read transistor 48 is connected to a source of a select read transistor 46. Transistor 46 has a gate or control electrode for receiving a Read Word Line 0 select signal. A drain of transistor 46 is connected to a read bit line 0. A drain of read transistor 52 is connected to a source of a select read transistor 50. Transistor 50 has a gate or control electrode for receiving a Read Word Line N select signal. A drain of transistor 50 is connected to a read bit line N. In the illustrated form transistors 46, 48, 50 and 52 are N-channel transistors. Additional read bit lines (not shown) may be used between the read bit line 0 and read bit line N. A memory control logic 54 provides various control functions for the multiple port memory 10 including providing the low voltage write enable signal. Memory control logic 54 has an input at a test port labeled Test Enable that is received from a test control unit that is external to the memory 10. The Test Enable signal provides an ability to turn on and off the low voltage write enable signal through a test mode for silicon debug of a voltage sensitive read or write failure.

In operation, the multiple-port memory 10 operates to separately read data in a read mode of operation and program or write data in a program or write mode of operation. The read mode of operation will not be described in detail. The write mode of operation functions to have both a high voltage mode of operation and a low voltage mode of operation. For purposes of understanding, the terms "high voltage" and "low voltage" are relative wherein the high voltage may only be one or several tenths of a volt more than the low voltage. By way of example only, one value of high voltage may be 1.0 volt and a value of low voltage may be 0.7 volt. When operating in the high voltage mode of operation, a single bit of the multiple-port memory 10 may be programmed to store data on the storage node 24 or read from the storage node 24. The multiple address write ports are independent and include a Write Port 1 and a Write Port 0 which each receive an address. In a dual port operation in the high voltage mode, the write port 1 address and write port 0 address are different in functional operating conditions.

Assume initially that the memory 10 is in the high voltage write mode. In this operational condition, the memory control logic 54 detects a sufficient value of supply voltage $V_{DD}$ and deasserts the low voltage write enable signal. In response to the low voltage write enable signal being deasserted, the multiplexer 30 will be configured to output the write port 1 address. In the high voltage mode, the multiplexer 30 directly couples the write port 1 address to the write word line decoder 32. The write word line 1 will get asserted high in response to its corresponding address being provided to the write port 1 address input. The write word line 1 turns on pass transistors 34 and 36. Transistors 34 and 36 allow the data to be written to the storage node 24 via the write port 1 data in and write port 1 data inB (complement). The write port 1 data in and write port 1 data inB are respectively coupled onto the Write Bitline 1 and Write Bitline B1. The multiplexers 42 and 44 pass the write port 1 data in and write port 1 B data in as a result of the low voltage write enable signal being a low value. The driver circuits 39 and 45 write the data value respectively received by the Write Bitline B1 and Write Bitline 1 into the memory cell 12. In this mode of operation, the write word line 0 is not asserted when the write word line 1 is asserted. Therefore, pass transistors 38 and 40 are nonconductive.

Assume now in the high voltage mode of operation that the write port 0 address is received and passed directly to the write word line decoder 32. The write word line 0 will get asserted high in response to its corresponding address being provided to the write port 0 address input. The write word line 0 turns on pass transistors 38 and 40. Transistors 38 and 40 allow the data to be written to the storage node 24 via the write port 0 data in and write port 0 data inB (complement). The multiplexers 42 and 44 are configured as a result of the low voltage write enable signal being a low value to respectively pass the write port 1 Data InB and Write port 1 Data In. The driver circuits 41 and 43 write the data value respectively received by the write port 0 data inB and write port 0 data in into the memory cell 12. In this mode of operation, the write word line 1 is not asserted when the write word line 0 is asserted. Therefore, pass transistors 34 and 36 are nonconductive.

Assume however that the supply voltage that is desired to be used in the semiconductor memory 10 is low enough in magnitude that the high voltage mode of operation described above is not high enough to ensure an adequate write margin. In this operational condition, the memory control logic 54 detects an insufficient value of supply voltage $V_{DD}$ and asserts the low voltage write enable signal as an active high signal. In response to the low voltage write enable signal being asserted, the multiplexer 30 will be configured to output the write port 0 address. Therefore, both inputs of the write word line decoder 32 receive the write port 0 address. In response to receiving the same inputs, the write word line 1 signal is the same as the write word line 0 signal. As a result of the same signals, each of pass transistors 34 and 36 and pass transistors 38 and 40 are conductive when write word line 0 and write word line 1 are asserted during a write operation. The assertion of the low voltage write enable signal configures the multiplexers 42 and 44 to respectively couple the write port 0 data inB and the write port 0 data in to the inputs of the respective driver circuits 39 and 45. As a result, the bit cell 12 is written by two data driver circuits 43 and 45 and their complements for the same data. The advantage of this dual drive is that there is a double strength of writing data into the storage node 24 through pass transistors 40 and 36, respectively, and their complements. The doubling of writing strength increases the write margin under low values of supply voltage.

It should be understood that while memory 10 illustrates a plurality of write ports in the form of two write ports, additional write ports may be added and configured with a multiplexer and write driver connected to the storage node 24 via a pass transistor. In this alternate configuration, the additional write ports may be used to even further increase the strength of the data bit being written or to have additional write ports, each having double drive strength. It should be understood that the memory control logic 54 may be configured so that the low voltage mode of operation is not entered for all write operations and is not required to have a particular voltage transition sequence. Therefore, in another form a low voltage mode is entered upon start-up and the memory is configured into a dual drive mode at double strength upon a supply voltage changing from a low voltage value to a higher voltage value. In yet another embodiment, the low voltage double strength write mode is selectively entered only for a set of predetermined write port addresses that contain a plurality of weak bits with reduced write margins under the low voltage condition.

Figure 2:
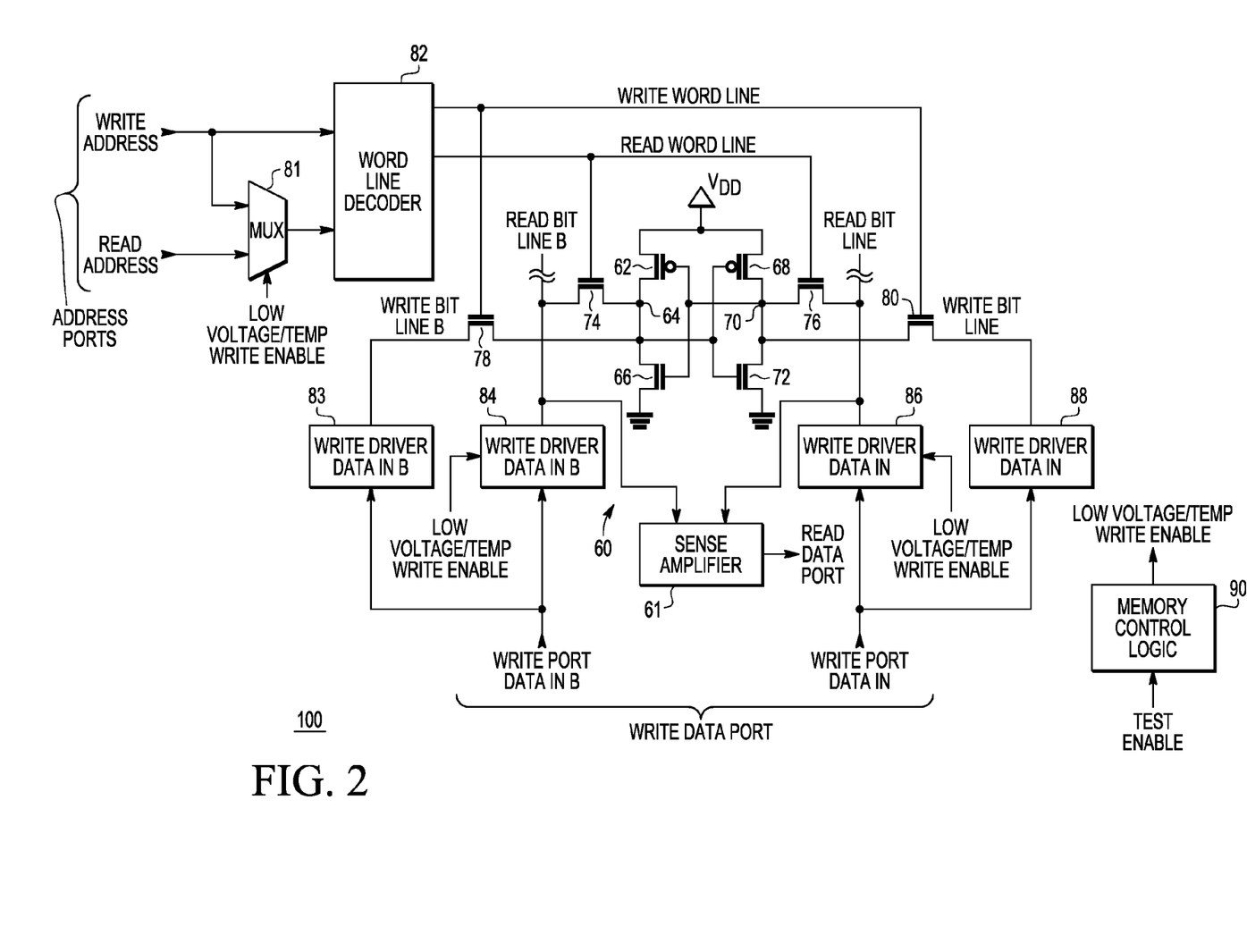
FIG. 2 is a block diagram of a second form of a semiconductor memory having a read port which is selectively used as a write port.

Illustrated in FIG. 2 is a multiple port memory 100 having one write data port and one read data port rather than having two write ports as in the memory 10. In a normal operation, the read port and write port are not active simultaneously for a same bit cell. Memory 100 may provide read data and receive write data during a same memory cycle. Multiple port memory 100 has a bit cell 60 having a source of a P-channel transistor 62 connected to a power supply terminal labeled $V_{DD}$. A drain of transistor 62 is connected to a storage node 64 and to a drain of an N-channel transistor 66. A source of transistor 66 is connected to a ground reference terminal. A gate of transistor 62 is connected to a gate of transistor 66 at a storage node 70. A P-channel transistor 68 has a source connected to the $V_{DD}$ power supply terminal and a drain connected to a drain of an N-channel transistor 72 at a storage node 70. A gate of transistor 68 is connected to a gate of transistor 72 at the storage node 64. Multiple port memory 100 has two address ports, a write address port and a read address port. A write address is connected to a first input of a multiplexer 81 and to a first input of a word line decoder 82. A read address is connected to a second input of the multiplexer 81. A control input of multiplexer 81 is connected to a low voltage write enable signal. When the low voltage write enable signal is asserted, multiplexer 81 passes the write address. When the low voltage write enable signal is not asserted, multiplexer 81 passes the read address. An output of the multiplexer 81 is connected to a second input of the word line decoder 82. A first output of the word line decoder 82 provides a write word line and a second output of the word line decoder 82 provides a read word line. The read word line is connected to a gate of a pass transistor 74 and a pass transistor 76. The write word line is connected to a gate of a pass transistor 78 and a pass transistor 80. In the illustrated form pass transistors 74, 76, 78 and 80 are N-channel transistors.

The write data port receives both Write Port Data and complementary Write Port Data, which is designated as Write Port Data InB. The Write Port Data InB is connected to an input of both a write driver data inB 83 and a write driver data inB 84. The write driver data inB 83 is continuously enabled when multiple port memory 100 is powered. The write drive data inB 84 has a control terminal for receiving the low voltage write enable signal and is selectively enabled. An output of the write driver data inB 83 provides a complementary write bit line labeled write bit lineB and is connected to a source of pass transistor 78. A drain of pass transistor 78 is connected to the storage node 64. An output of the write driver data inB 84 provides a complementary read bit line labeled read bit lineB and is connected to a source of pass transistor 74. A drain of pass transistor 74 is connected to the storage node 64.

The Write Port Data In is connected to an input of both a write driver data in 86 and a write driver data in 88. The write driver data in 88 is continuously enabled when multiple port memory 100 is powered. The write driver data in 86 has a control terminal for receiving the low voltage write enable signal and is selectively enabled. An output of the write driver data in 88 provides a write bit line and is connected to a source of pass transistor 80. A drain of pass transistor 80 is connected to the storage node 70. An output of the write driver data in 86 provides a read bit line and is connected to a source of pass transistor 76. A drain of pass transistor 76 is connected to the storage node 70. The read bit line is connected to a first input of a sense amplifier 61 and the complementary read bit line, read bit line B, is connected to a second input of the sense amplifier 61. An output of sense amplifier 61 provides read data at a read data port. A memory control logic 90 provides various control functions for the multiple port memory 100 including providing the low voltage write enable signal.

In operation, assume that the high voltage mode of operation is initially present wherein the low voltage write enable signal is a logic low value resulting in write drivers 84 and 86 being disabled. There are separate read and write ports. In the high voltage mode, the Read address is coupled, via the multiplexer 81, onto the input of the word line decoder 82 that asserts the READ word line. In response pass transistors 74 and 76 are made conductive. The data at the storage node 70 of bit cell 60 is read out through sense amplifier 61 at the Read Data port.

In a write mode of operation, assume initially that the memory 100 is in the high voltage write mode. In the high voltage mode, the multiplexer 81 is configured to directly couple the Read Address to the second input of the word line decoder 82. During a write operation, the Write Address is directly connected to the first input of the word line decoder 82 and is provided to the write word line. In response, the pass transistors 78 and 80 are made conductive. Transistors 78 and 80 allow the data to be written to the storage node 70 via the write port data in and write port data inB (complement). The drivers 83 and 88 write the data value respectively received by the write port data inB and the write port data in into the memory cell 60. In this mode of operation, the write drivers 84 and 86 are not active in response to the low voltage write enable signal having a low value.

Assume however that the supply voltage that is desired to be used in the semiconductor memory 100 is low enough in magnitude that the high voltage mode of operation described above is not sufficiently large enough in magnitude to ensure an adequate write margin. In this operational condition, the memory control logic 54 detects an insufficient value of supply voltage $V_{DD}$ and asserts the low voltage write enable signal as an active high signal. In response to the low voltage write enable signal being asserted, the multiplexer 81 will be configured to output the write address to the second input of the word line decoder 82. Therefore, both inputs of the write word line decoder 82 receive the write address. During a write operation in response to word line decoder 82 receiving the address corresponding to memory cell 60 on both its first and second inputs, both the write word line signal and the read word line signal are asserted resulting in pass transistors 78 and 80 and pass transistors 74 and 76 being conductive. The assertion of the low voltage write enable signal makes each of the write driver data in 86 and write driver data inB 84 active to drive their respective inputs onto the storage node 70 through the respective read bit lines. Therefore, during the write operation in the low voltage mode, the bit cell 60 is written by data drivers 86 and 88 and their complements for the same data. The advantage of this dual drive is that there is a double strength of writing data into the storage node 70 through pass transistors 80 and 76, respectively, and their complements. The doubling of writing strength increases the write margin under low values of supply voltage. While write drivers 84 and 86 are enabled during the write operation, they are disabled during the read operation so that the data at the storage node 70 of bit cell 60 can be read out through sense amplifier 61 at the Read Data port.

In summary, the multiple port memory 100 selectively merges the write address port onto the read address port which implements a doubling of the writing strength into the storage node 70 of the bit cell 60. It should be appreciated that additional read or write ports can be added for enhanced functionality, each of which may be configured to have a selective increase in drive strength of the storage node 70. It should be understood that while a doubling of drive strength is illustrated, other drive strength amounts may be implemented by adding additional ports, drivers and associated control in parallel with those that are illustrated. It should be understood that while circuitry for merging the write address ports onto the read address port by using an address multiplexer 81 is illustrated, other methods and circuits may be implemented by providing a same write and read address directly onto the word line decoder 82 through an address bus under the control of memory control logic 90 and an address generation unit (not shown).

Figure 3:
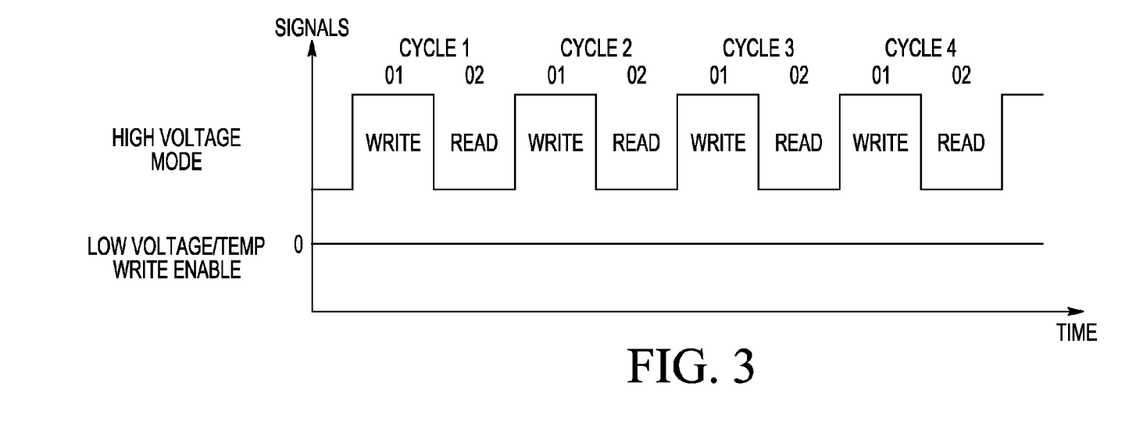
FIGS. 3 and 4 are timing diagrams illustrating functionality and timing on a memory cycle-by-cycle basis of the semiconductor memory of FIG. 1.

Illustrated in FIG. 3 is an exemplary timing diagram of operation of either multiple port memory 10 of FIG. 1 or multiple port memory 100 of FIG. 2. Timing signals associated with a high voltage mode are provided wherein the low voltage write enable signal has a logic low value in this mode. In the high voltage mode, four cycles are illustrated with each cycle having two equal phases. A read or a write operation can occur in each phase. Assume for illustration purposes that phase 1 is a write operation and that phase 2 is a read operation. It should be understood that other sequences of memory operations may be implemented. Because the supply voltage is determined to be sufficiently high, the write operations during phase 1 meet the required write margin. Phase 1 can be configured for a write from either one of the write ports of the dual write address ports of memory 10. Similarly, the phase 2 can be configured for a read from one of the multiple read ports. For multiple port memory 10 of FIG. 1 it should be understood that in the high voltage mode of operation, two write operations per cycle phase using two different ports may be accomplished. For multiple port memory 10 of FIG. 1 it should also be understood that if the supply voltage is determined to be too low to ensure a proper write margin, the low voltage write enable signal is asserted as a logic high signal and the same memory operations occur as shown, but with only one write operation in a clock phase.

Figure 4:
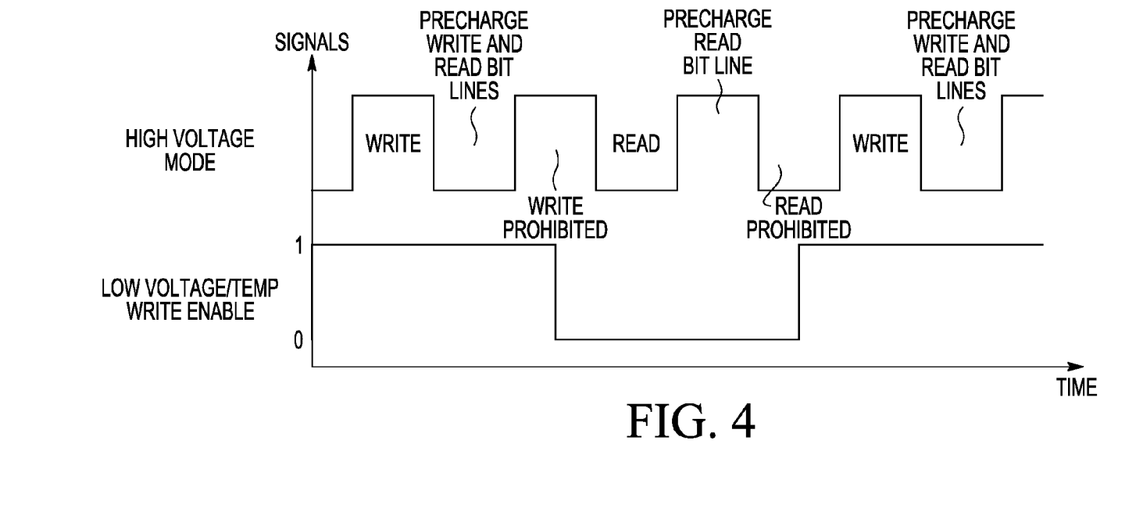

Illustrated in FIG. 4 is an illustrative timing diagram of operation of the multiple port memory 100 of FIG. 2 when in the low voltage mode for a portion of the example. The memory is configured to perform a write or a read in one cycle as opposed to being able to perform a read and a write in one cycle as in FIG. 3. A write operation occurs in the first phase of the memory cycle 1. The second phase of the same cycle is used to precharge write and read bit lines. In the next phase, a read has been detected. In one form the memory control logic 90 is able to determine what upcoming memory operations will be. In order to permit the read operation to occur, a write operation must be prevented from occurring in the first phase of the second cycle. The write needs to be prevented because the read bit lines would be precharging during the read operation resulting in incorrect data read. In the first phase of the second cycle, the low voltage write enable signal goes low and a transition back to the high voltage mode occurs. The high voltage mode of operation will remain until the memory control logic 90 detects a pending write command. A low value of the low voltage write enable signal is needed during all read operations to ensure that the read word lines are not disturbed by the coupling of the write address to both of the inputs of the word line decoder 82. As a result of detecting an upcoming write operation, the immediately preceding phase prohibits a read from occurring. The read needs to be prevented because the read bit lines would be precharging during a write and the read bit lines need to be used during the write. Therefore, the read operation must be prevented from occurring in the phase immediately preceding the write operation. The cycles in which write and read operations are prevented does result in loss of throughput in the multiple port memory 100 and is the cost of improved write margin at low power supply voltages.

Figure 5:
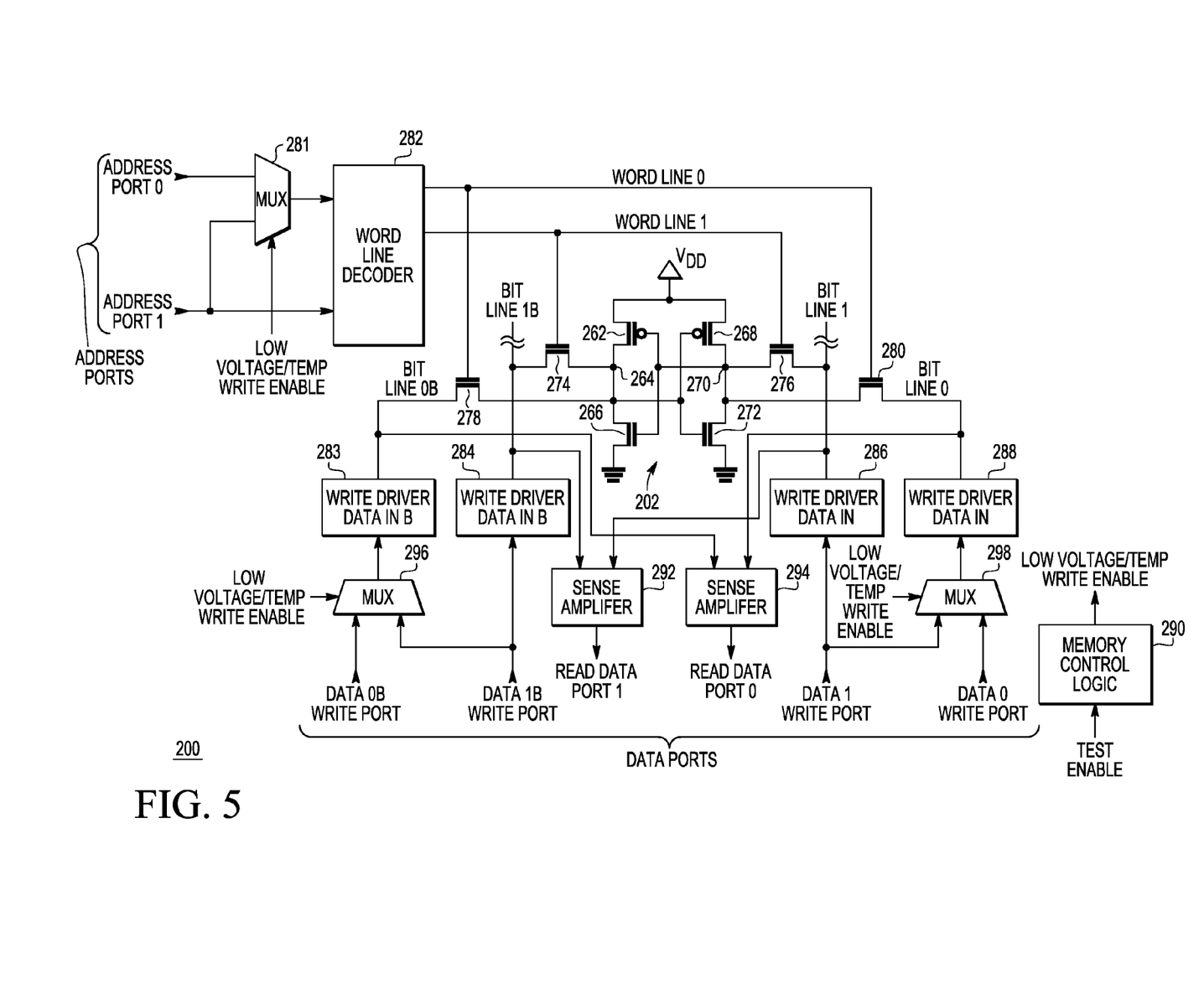
FIG. 5 is a block diagram of yet another form of a semiconductor memory having multiple write ports which can also vary in the number which are used.

Illustrated in FIG. 5 is a multiple port memory 200 that has two generic address ports, each of which is capable of being configured as a read port, a write port or both. There are also two data ports, data port 0 and data port 1. Multiple port memory 200 has a bit cell 202 having a source of a P-channel transistor 262 connected to a power supply terminal labeled $V_{DD}$. A drain of transistor 262 is connected to a storage node 264 and to a drain of an N-channel transistor 266. A source of transistor 266 is connected to a ground reference terminal. A gate of transistor 262 is connected to a gate of transistor 266 at a storage node 270. A P-channel transistor 268 has a source connected to the $V_{DD}$ power supply terminal and a drain connected to a drain of an N-channel transistor 272 at the storage node 270. A gate of transistor 268 is connected to a gate of transistor 272 at the storage node 264. Multiple port memory 200 has two address ports labeled Address port 0 and Address port 1 which can receive either a read address or a write address. The Address port 1 is connected to a first input of a multiplexer 281 and to a first input of a word line decoder 282. The Address port 0 is connected to a second input of the multiplexer 281. A control input of multiplexer 281 is connected to a low voltage write enable signal. When the low voltage write enable signal is asserted, multiplexer 281 passes the address from Address port 1. When the low voltage write enable signal is not asserted, multiplexer 281 passes the address from Address port 0. An output of the multiplexer 281 is connected to a second input of the word line decoder 282. A first output of the word line decoder 282 provides a first word line, word line 0, and a second output of the word line decoder 282 provides a second word line, word line 1. The word line 1 is connected to a gate of a pass transistor 274 and a pass transistor 276. The word line 0 is connected to a gate of a pass transistor 278 and a pass transistor 280. In the illustrated form pass transistors 274, 276, 278 and 280 are N-channel transistors.

The data ports include both two write ports and two read ports. Each write data port receives both Write Port Data and complementary Write Port Data, which is designated as Data 0B or Data 1B. The Data 1B write port is connected to an input of both a write driver data inB 284 and a first input of a multiplexer 296. The write driver data inB 284 drives data onto bit line 1B only during a write operation. The Data 0B write port is connected to a second input of multiplexer 296. Multiplexer 296 has a control terminal for receiving the low voltage write enable signal. When the low voltage write enable signal is asserted, multiplexer 296 passes the data on the Data 1B write port. When the low voltage write enable signal is not asserted, multiplexer 296 passes the data on the Data 0B write port. An output of the multiplexer 296 is connected to an input of a write driver data inB 283. An output of the write driver data inB 283 provides a complementary bit line labeled bit line 0B and is connected to a source of pass transistor 278. A drain of pass transistor 278 is connected to the storage node 264. An output of the write driver data inB 284 provides a complementary bit line labeled bit line 1B and is connected to a source of pass transistor 274. A drain of pass transistor 274 is connected to the storage node 264.

The Data 1 Write Port is connected to an input of both a write driver data in 286 and a first input of a multiplexer 298. A second input of the multiplexer 298 is connected to the Data 0 Write Port. Multiplexer 298 has a control terminal for receiving the low voltage write enable signal. When the low voltage write enable signal is asserted, the multiplexer 298 passes the data on the Data 1 write port. When the low voltage write enable signal is not asserted, the multiplexer 298 passes the data on the Data 0 write port. An output of the multiplexer 298 is connected to an input of a write driver data in 288. An output of the write driver data in 288 provides a bit line 0 and is connected to a source of pass transistor 280. A drain of pass transistor 280 is connected to the storage node 270. An output of the write driver data in 286 provides a bit line 1 and is connected to a source of pass transistor 276. A drain of pass transistor 276 is connected to the storage node 270. The bit line 1 and bit line 0 are connected to a first input of each of a sense amplifier 292 and a sense amplifier 294, respectively. The bit line 1B and bit line 0B are connected to a second input of each of the sense amplifier 292 and sense amplifier 294, respectively. An output of sense amplifier 294 provides read data at a read data port 0. An output of sense amplifier 292 provides read data at a read data port 1. A memory control logic 290 provides various control functions for the multiple port memory 200 including providing the low voltage write enable signal.

In operation, the memory 200 functions to both read data and to program or write data. The read operation of memory 200 is substantially the same as was described in FIG. 2 in connection with memory 100 which had one read port. Memory 200 may have one or two read ports. Memory 200 can be configured into operational modes of one read port and one write port, two read ports and two write ports. In a read operation, assume that the high voltage mode is established in the memory 200 by the memory control logic 290. In the high voltage mode, a Read address is coupled onto one of the address ports and input to the word line decoder 282. Assume for illustration purposes only, that the read address is provided to the Address Port 0. In response, the word line decoder 282 asserts the Word Line 0. In response pass transistors 278 and 280 are made conductive. The data at the storage node 270 of bit cell 202 is read out through sense amplifier 294 at the Read Data port 0.

In a write mode of operation, assume initially that the memory 200 is in the high voltage write mode. In the high voltage mode, the multiplexer 281 is configured to directly couple the address at the Address Port 0 to the first input of the word line decoder 282. Assume for illustration purposes only, that a write address is provided to the Address Port 0. The word line decoder 282 asserts the word line 0 in response thereto. In response to an asserted word line 0, the pass transistors 278 and 280 are made conductive. Transistors 278 and 280 allow the data to be written to the storage node 270 via the Data 0 write port and Data 0B write port (complement). The drivers 283 and 288 write the data value respectively received by the data 0B write port and the data write port into the memory cell 202. Additionally, the write drivers 284 and 286 are responsive to the Data 1B write port and the Data 1 write port, respectively. However, since the word line 1 is not asserted by the word line decoder 282, there is no data being coupled to the memory bit cell 202 from the Data 1 write port. In the high voltage mode, the low voltage write enable signal configures the multiplexers 296 and 298 to respectively pass the two data 0 write ports, which are the Data 0B write port and the Data 0 write port.

Assume however that the supply voltage that is desired to be used in the semiconductor memory 200 is low enough in magnitude that the high voltage mode of operation described above is not high enough to ensure an adequate write margin. In this operational condition, the memory control logic 290 detects an insufficient value of supply voltage $V_{DD}$ and asserts the low voltage write enable signal as an active high signal. In response to the low voltage write enable signal being asserted, the multiplexer 281 will be configured to output the address port 1 to the first input of the word line decoder 282. Therefore, both inputs of the word line decoder 282 receive the address on the address port 1. During a write operation, in response to word line decoder 282 receiving the address corresponding to memory cell 202 on both its first and second inputs, both the word line 0 and word line 1 signals are asserted resulting in pass transistors 278 and 280 and pass transistors 274 and 276 being conductive. Therefore, both the word line 0 and the word line 1 are asserted in the memory cell 202. The assertion of the low voltage write enable signal couples the passing of the data 1 write port and the data 1B write port respectively through the multiplexers 298 and 296 onto the respective input of write driver 288 and write driver 283 through the multiplexers 298 and 296. Additionally, the data 1 write port is connected directly to the input of the write driver 286 which is in an active mode of operation. The write driver 286 will drive the data onto storage node 270 through pass transistor 276 by using the bit line 1. Therefore, during the write operation in the low voltage mode, the bit cell 202 is written by data drivers 286 and 288 and their complements for the same data. The advantage of this dual drive is that there is a double strength of writing data into the storage node 270 through pass transistors 280 and 276, respectively, and their complements. The doubling of writing strength increases the write margin under low values of supply voltage.

In summary the multiple port memory 200 selectively merges two address ports and two data ports to implement a doubling of the writing strength into the storage node 270 of the bit cell 202. It should be appreciated that additional address and data ports can be added for enhanced functionality, each of which may be configured to have a selective increase in drive strength of the storage node 270. It should be understood that while a doubling of drive strength is illustrated, other drive strength amounts may be implemented by adding additional ports, drivers and associated control in parallel with those that are illustrated. It should also be understood that while circuitry for merging address ports and data ports by using address multiplexer 281 and write data port multiplexers 298 and 296 is illustrated, other methods may be implemented by providing a same address on two address ports and a same data onto the two write data ports externally from an address generation bus unit (not shown) and a write data bus (not shown) coupled to memory 200 under the control of the memory control logic 290.

By now it should be appreciated that there has been provided a multiple port (multi-port) memory that is capable of selective combination of write ports for a memory write operation to improve bit cell write margin. When two or more write ports are simultaneously activated to perform a write operation to a bit cell, two write wordlines are asserted and data is driven onto the bitline pairs of both write ports. With two pairs of pass gates conducting, the conductance of selected pass transistors that are coupled to the memory bit cell in parallel increases, thereby decreasing the resistance of the pass transistors relative to the resistance of pull-up transistors, and pull-down transistors on the complement side, of the memory bit cell. The increased conductance from making two coupling transistors conductive therefore makes the memory bit cell easier to write. The number of write ports that are connected together may vary in response to the memory bit cell's operating condition, such as whether the bit cell is in a test mode or an operating mode, or whether high throughput performance operation is needed or not. For lower throughput applications, a significantly lower voltage may be used in the low voltage write mode and power consumption significantly lowered. The ability to vary the number of write ports which are used to perform a write operation may also be used for test or debug purposes. For example, a general purpose register (GPR) write failures have been observed in multiple technology generations. Without a properly functioning GPR, the functionality of an integrated circuit is limited. With the circuit embodiments described herein, the write failures may be avoided. With the ability of turning on and off the low voltage write enable signal through a test port, it makes a silicon debug of a Vmin failure easier to distinguish whether it is a write Vmin failure or a read Vmin failure. For example, if a failure is detected after writing in the low voltage mode, a subsequent write in a dual voltage mode may be made. The second write operation will correct and remove most write failures so that a subsequent failure can be accurately determined to be a read Vmin failure. When a read port is used as a write port during a write operation, the memory bit cell transistor parameters can be designed to be skewed to favor read margin so that at lower voltages two write ports are used for successful writes. Thus the embodiments described herein permit the ability to vary the number of write ports with respect to the operating condition of the memory bit cell by adjusting data throughput as a function of reliable bit cell write operation.

It should be understood that any of the memory control logic 54, memory control logic 90 and memory control logic 290 may be configured to modify the number of write ports in response to a change in operating temperature or some other operation condition rather than operating voltage. For example, in one embodiment, the first mode is characterized by the multi-port memory being operated at a first temperature and the second mode is characterized by the multi-port memory being operated at a second temperature, wherein the second temperature differs from the first temperature. In one form the second temperature is lower than the first temperature.

There is herein provided in one form a multi-port memory having a memory cell having a storage node. A first pass transistor is coupled between the storage node and a first port. A second pass transistor is coupled between the storage node and a second port. Write circuitry is coupled to the first port and the second port for writing data in a first mode to the storage node from one of the first port and the second port through one of the first pass transistor and second pass transistor, respectively, when the multi-port memory is powered by a first voltage at a power supply node. Data is written in a second mode to the storage node simultaneously from the first port and the second port simultaneously through the first pass transistor and second pass transistor when the multi-port memory is powered by a second voltage different than the first voltage at the power supply node. In another form the memory further has a read circuit coupled to the storage node. In one form the write circuitry selectively chooses between the first port and second port for writing data. In another form the write circuitry has a first multiplexer having a first input for receiving data to be written from the first port, a second input for receiving data to be written from the second port, and an output coupled to the first port. In yet another form the first port has a portion for enabling the first pass transistor and the second port has a portion for enabling the second pass transistor. The write circuitry further has a second multiplexer having a first input for receiving an enable signal for the first pass transistor from the portion of the first port for enabling the first pass transistor, a second input for receiving an enable signal for the second pass transistor from the portion of the second port for enabling the second pass transistor, and an output coupled to the first pass transistor. In another form the memory cell has a second storage node. The multi-port memory further has a third pass transistor coupled between the storage node and a complement of the first port. A fourth pass transistor is coupled between the storage node and a complement of the second port. The write circuitry is coupled to the complements of the first port and the second port for writing data in the first mode to the second storage node from the complement of the one of the first port and the second port through the third pass transistor or fourth pass transistor, respectively, when the multi-port memory is powered by the first voltage at the power supply node. Data is written in a second mode to the second storage node simultaneously from the complements of the first port and the second port simultaneously through the third pass transistor and fourth transistor when the multi-port memory is powered by the second voltage different than the first voltage at the power supply node. In another form the first port is a write port and the second port is a read port in the first mode. In yet another form the memory has a sense amplifier coupled to the second port. In yet another form of the multi-port memory the write circuitry has a first multiplexer having a first input for receiving data to be written from the first port, a second input for receiving data to be written from the second port in the second mode, and an output coupled to the first port. In yet another form the first port and second port function as independent read/write ports in the first mode. In yet another form the multi-port memory further has a first sense amplifier coupled to the first port and a second sense amplifier coupled to the second port.

In yet another form there is herein provided a method of operating a multi-port memory. Data is written in a first mode to a storage node of a memory cell from a first port through a first conductance, wherein the first mode is characterized by a power supply voltage being applied at a power node at a first level. Data is written in a second mode to the storage node of the memory cell simultaneously from the first port through the first conductance and a second port through a second conductance, wherein the second mode is characterized by the power supply voltage being applied at the power node at a second level different from the first level. In another form the second level is lower than the first level. In another form data stored at the storage node is read through a sense amplifier coupled to the storage node during the first mode and the second mode. In yet another form data stored at the storage node is read through a first sense amplifier coupled to the second port. In yet another form data stored at the storage node is read through a second sense amplifier coupled to the first port. In yet another form the first conductance equals the second conductance. In another form the first conductance is achieved through a first conductive transistor coupled between the storage node and the first port, and the second conductance is achieved through a second conductive transistor coupled between the storage node and the second port.

In another form there is provided a method of operating a multi-port memory by writing data through a first port, independent of operation of a second port, to a storage node of a memory in a first mode of operation. Data is simultaneously written data through the first port and the second port to the storage node in a second mode of operation. In yet another form the first mode is characterized by the multi-port memory being operated at a first temperature. The second mode is characterized by the multi-port memory being operated at a second temperature, wherein the second temperature differs from the first temperature. In one form the second temperature is lower than the first temperature.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, various bit cell transistor structures and various types of sense amplifiers may be used. Transistors of differing conductivity types may be readily implemented to perform the described functions. Any of various multiplexer circuits and driver circuits may be used. The layout of the memory circuits may be either symmetrical in nature or non-symmetrical. Logic may be included to determine when the low voltage mode and high voltage modes are used based upon desired performance levels and power consumption criteria. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A multi-port memory, comprising:
   a memory cell having a storage node;
   a first pass transistor coupled between the storage node and a first port;
   a second pass transistor coupled between the storage node and a second port; and
   write means coupled to the first port and the second port for:
      writing data in a first mode to the storage node from one of the first port and the second port through one of the first pass transistor and the second pass transistor, respectively, when the multi-port memory is powered by a first voltage at a power supply node; and
      writing data in a second mode to the storage node simultaneously from the first port and the second port simultaneously through the first pass transistor and the second pass transistor when the multi-port memory is powered by a second voltage different than the first voltage at the power supply node.

2. The multi-port memory of claim 1, further comprising: a read circuit coupled to the storage node.

3. The multi-port memory of claim 2, wherein the write means is further characterized by selectively choosing between the first port and the second port for writing data.

4. The multi-port memory of claim 3, wherein the write means comprises a first multiplexer having a first input for receiving data to be written from the first port, a second input for receiving data to be written from the second port, and an output coupled to the first port.

5. The multi-port memory of claim 4, wherein:
   the first port has a portion for enabling the first pass transistor;
   the second port has a portion for enabling the second pass transistor; and
   the write means further comprise a second multiplexer having a first input for receiving an enable signal for the first pass transistor from the portion of the first port for enabling the first pass transistor, a second input for receiving an enable signal for the second pass transistor from the portion of the second port for enabling the second pass transistor, and an output coupled to the first pass transistor.

6. The multi-port memory of claim 1, wherein:
   the memory cell has a second storage node;
   the multi-port memory further comprises:
      a third pass transistor coupled between the storage node and a complement of the first port;
      a fourth pass transistor coupled between the storage node and a complement of the second port; and
      the write means is coupled to the complement of each of the first port and the second port for writing data in the first mode to the second storage node from the complement of the one of the first port and the second port through the third pass transistor or fourth pass transistor, respectively, when the multi-port memory is powered by the first voltage at the power supply node and writing data in a second mode to the second storage node simultaneously from the complements of the first port and the second port simultaneously through the third pass transistor and fourth transistor when the multi-port memory is powered by the second voltage different than the first voltage at the power supply node.

7. The multi-port memory of claim 1 wherein the first port is a write port and the second port is a read port in the first mode.

8. The multi-port memory of claim 7, further comprising a sense amplifier coupled to the second port.

9. The multi-port memory of claim 8, wherein the write means comprises a first multiplexer having a first input for receiving data to be written from the first port, a second input for receiving data to be written from the second port in the second mode, and an output coupled to the first port.

10. The multi-port memory of claim 1, wherein the first port and the second port function as independent read/write ports in the first mode.

11. The multi-port memory of claim 10, further comprising:

a first sense amplifier coupled to the first port; and a second sense amplifier coupled to the second port.

12. A method of operating a multi-port memory comprising:

writing data in a first mode to a storage node of a memory cell from a first port through a first conductance, wherein the first mode is characterized by a power supply voltage being applied at a power node at a first level; and     writing data in a second mode to the storage node of the memory cell simultaneously from the first port through the first conductance and a second port through a second conductance, wherein the second mode is characterized by the power supply voltage being applied at the power node at a second level different from the first level.

13. The method of claim 12, wherein the second level is lower than the first level.

14. The method of claim 13, further comprising reading data stored at the storage node through a sense amplifier coupled to the storage node during the first mode and the second mode.

15. The method of claim 12, further comprising reading data stored at the storage node through a first sense amplifier coupled to the second port.

16. The method of claim 15, further comprising reading data stored at the storage node through a second sense amplifier coupled to the first port.

17. The method of claim 12, wherein the first conductance equals the second conductance.

18. The method of claim 17, wherein the first conductance is achieved through a first conductive transistor coupled between the storage node and the first port and the second conductance is achieved through a second conductive transistor coupled between the storage node and the second port.

19. A method of operating a multi-port memory:

writing data through a first port, independent of operation of a second port, to a storage node of a memory in a first mode of operation; and     simultaneously writing data through the first port and the second port to the storage node in a second mode of operation, wherein:

the first mode is characterized by the multi-port memory being operated at a first temperature; and the second mode is characterized by the multi-port memory being operated at a second temperature, wherein the second temperature differs from the first temperature.

\* \* \* \* \*